(12) United States Patent
Park et al.

(10) Patent No.: US 10,594,387 B2
(45) Date of Patent: Mar. 17, 2020

(54) SOLAR CELL INTEGRATED WITH RADIO WAVE TRANSCEIVING APPARATUS

(71) Applicant: AJOU UNIVERSITY INDUSTRY-ACADEMIC COOPERATION FOUNDATION, Suwon-si, Gyeonggi-do (KR)

(72) Inventors: Ikmo Park, Yongin-si (KR); Jaejin Lee, Seoul (KR); Ta Son Xuat, Suwon-si (KR)

(73) Assignee: AJOU UNIVERSITY INDUSTRY-ACADEMIC COOPERATION FOUNDATION, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/956,257

(22) Filed: Apr. 18, 2018

(65) Prior Publication Data

US 2018/0302149 A1 Oct. 18, 2018

(30) Foreign Application Priority Data

Apr. 18, 2017 (KR) .................. 10-2017-0049983

(51) Int. Cl.
*H04B 7/185* (2006.01)
*H02S 10/40* (2014.01)
(Continued)

(52) U.S. Cl.
CPC ....... *H04B 7/18515* (2013.01); *H01L 27/142* (2013.01); *H01L 31/046* (2014.12);
(Continued)

(58) Field of Classification Search
CPC .............. H04B 7/18515; H01L 31/046; H01L 31/02021; H01L 27/142; H01Q 1/288;
(Continued)

(56) References Cited

U.S. PATENT DOCUMENTS 5,280,297 A * 1/1994 Profera, Jr. .............. H01Q 3/46
343/700 MS
5,874,924 A * 2/1999 Csongor ................ H01Q 1/288
343/789
(Continued)

FOREIGN PATENT DOCUMENTS

JP 2013-055639 A 3/2013
KR 10-2015-0110373 A 10/2015
(Continued)

OTHER PUBLICATIONS

Zawadzki et al., Integrated RF antenna and Solar Array, Proceedings 2000 IEEE International Conference on Phased Array Systems and Technology (Cat. No. 00TH8510), pp. 239-242.*
(Continued)

*Primary Examiner* — Sonny Trinh
(74) *Attorney, Agent, or Firm* — Sughrue Mion, PLLC

(57) ABSTRACT

Disclosed is a solar cell integrated with a radio wave transceiving apparatus. A solar cell integrated with a radio wave transceiving apparatus according to an exemplary embodiment of the present disclosure may include a substrate; a solar cell in which a plurality of unit cells is periodically arranged on the upper surface of the substrate to form a metasurface; and a crossed dipole type radiator positioned on the solar cell.

10 Claims, 16 Drawing Sheets

(51) Int. Cl.
*H02S 99/00* (2014.01)
*H01Q 1/36* (2006.01)
*H01Q 21/26* (2006.01)
*H01L 31/0475* (2014.01)
*H01Q 1/28* (2006.01)
*H01Q 9/04* (2006.01)
*H01Q 1/44* (2006.01)
*H01Q 25/00* (2006.01)
*H01Q 9/06* (2006.01)
*H01L 31/046* (2014.01)
*H01L 27/142* (2014.01)
*H01Q 9/26* (2006.01)

(52) U.S. Cl.
CPC ......... *H01L 31/0475* (2014.12); *H01Q 1/288* (2013.01); *H01Q 1/364* (2013.01); *H01Q 1/44* (2013.01); *H01Q 9/0428* (2013.01); *H01Q 9/065* (2013.01); *H01Q 21/26* (2013.01); *H01Q 25/001* (2013.01); *H02S 10/40* (2014.12); *H02S 99/00* (2013.01); *H01Q 9/26* (2013.01)

(58) Field of Classification Search
CPC ........ H01Q 1/44; H01Q 25/001; H01Q 9/065; H01Q 21/26
USPC .......................................... 455/12.1, 428, 98
See application file for complete search history.

(56) References Cited

U.S. PATENT DOCUMENTS

2013/0069833 A1* 3/2013 Lippincott ............... H01Q 1/08
343/711
2015/0162656 A1* 6/2015 Fitz-Coy ................ H01Q 1/288
343/705
2018/0359023 A1* 12/2018 Howard ............. H04B 7/18513

FOREIGN PATENT DOCUMENTS

KR   10-2016-0066309 A   6/2016
KR   10-1698131 B1   1/2017

OTHER PUBLICATIONS

Pozar et al., A Microstrip Reflectarray Using Crossed Dipoles, IEEE Antennas and Propagation Society International Symposium. 1998 Digest. Antennas: Gateways to the Global Network. Held in conjunction with: USNC/URSI National Radio Science Meeting Cat. No. 98CH36 ), pp. 1008-1011.*
Korean Patent Office Action for Application No. 10-2017-0049983 dated Sep. 14, 2017.
Korean Patent Office Action for Application No. 10-2017-0049983 dated Mar. 29, 2018.

* cited by examiner

SOLAR CELL INTEGRATED WITH RADIO WAVE TRANSCEIVING APPARATUS

CROSS-REFERENCE TO RELATED APPLICATIONS

This application claims the priority of Korean Patent Application No. 10-2017-0049983 filed on Apr. 18, 2017, in the Korean Intellectual Property Office, the disclosure of which is incorporated herein by reference.

BACKGROUND

Field

The present disclosure relates to a solar cell integrated with a radio wave transceiving apparatus. More particularly, the present disclosure relates to a solar cell capable of enhancing the performance of a radio wave transceiving apparatus by forming a structure of a metasurface and stably supplying energy to the radio wave transceiving apparatus through energy harvesting.

Description of the Related Art

A cube satellite (CubeSat) is a standardized miniature satellite weighing about 1 kg which has a square shape with width×length×height of 10 cm. The cube satellite has been first developed for student education by satellite experts of the Standford University and the California Polytechnic State University in the USA in 1999.

Currently, design standards for developing the cube satellite are established, and the cube satellite has been frequently used for practical training of manufacture of satellites due to a feature that the costs of development and launching are low. In general, the total development cost including the launching cost for a single satellite amounts to hundreds of millions dollar, but the total development cost of the cube satellite is only about 100 to 200 thousand dollar.

As such, the cube satellites, which started for education, began to perform substantial scientific missions, unlike the initial purpose, due to the breakthrough of the electronics industry. Studies on earth observation and various aerospace environments are possible through formation flight of several cube satellites, and the cube satellites have become very valuable as a good verification tool capable of testing advanced space technology to be used for practical satellites.

In addition, many international conferences related with the cube satellites have been held every year around the world, and methods that can be applied in various fields such as earth observation, earthquake observation, and space exploration have been extensively studied. Recently, an application range such as medicine, biochemistry, space science, and new technology development is extended, and thus, the application value of the cube satellites has been gradually increased.

As such, the cube satellites, of which the application value is gradually increased, use solar cells to convert sunlight into electricity. The cube satellite has a surface area limited to the outer wall, and such a limited area is shared by various components such as a radio wave transceiving apparatus, an optical sensor, a camera lens, and a propulsion system with the solar cells.

However, until now, most of the cube satellites have separate radio wave transceiving apparatuses separated from the solar cells. Accordingly, there is a growing need for a solar cell integrated with a radio wave transceiving apparatus in which the solar cell does not interfere with the radio wave transceiving of the radio wave transceiving apparatus while the radio wave transceiving apparatus does not interfere with energy harvesting of the solar cell.

(Patent Document 0001) KR 10-2016-0066309 A "Satellite system equipped with Cubesat"

SUMMARY

An object to be achieved by the present disclosure is to provide a solar cell integrated with a radio wave transceiving apparatus.

The objects of the present disclosure are not limited to the aforementioned objects, and other objects, which are not mentioned above, will be apparent to a person having ordinary skill in the art from the following description.

According to an aspect of the present disclosure, there is provided a solar cell integrated with a radio wave transceiving apparatus including: a substrate; a solar cell in which a plurality of unit cells is periodically arranged on the upper surface of the substrate to form a metasurface; and a crossed dipole type radiator positioned on the solar cell.

Preferably, an arm of the radiator may have the same width as a gap disposed between the plurality of unit cells.

Preferably, the plurality of unit cells may be arranged in a lattice structure of 4×4.

Preferably, a plurality of unit metallic cells having square shapes may be arranged on the upper surface of the substrate in a lattice structure, and a solar cell having the same shape may be stacked on the upper surface of each of the plurality of unit metallic cells.

Preferably, the solar cell may further include a power feeding unit which is connected with a power feeding hole of the radiator to transmit a signal.

Preferably, a ground surface may be formed on the lower surface of the substrate.

Preferably, an inner side of the power feeding unit may be electrically connected with the power feeding hole of the radiator through the substrate, and an outer side of the power feeding unit may be electrically connected with the ground surface.

Preferably, the solar cell may be used for a cube satellite (CubeSat).

According to another aspect of the present disclosure, there is provided a solar cell integrated with a radio wave transceiving apparatus including: a lower substrate; an upper substrate stacked on the lower substrate; a solar cell in which a plurality of unit cells is periodically arranged on the upper surface of the upper substrate to form a metasurface; and a circularly polarized patch type radiator positioned between the lower substrate and the upper substrate.

Preferably, the radiator may have a slot therein.

Preferably, the plurality of unit cells may be arranged in a lattice structure of 4×4.

Preferably, a plurality of unit metallic cells having square shapes may be arranged on the upper surface of the upper substrate in a lattice structure, and a solar cell having the same shape may be stacked on the upper surface of each of the plurality of unit metallic cells.

Effects according to the present disclosure are as follows.

It is possible to enhance the performance of the radio wave transceiving apparatus without interfering with energy harvesting of the solar cell by integrating the solar cell forming the metasurface with the crossed dipole type radiator. Further, it is possible to enhance the performance of the radio wave transceiving apparatus without interfering with energy harvesting of the solar cell by integrating the solar cell forming the metasurface with the circularly polarized patch type radiator. As such, it is possible to enhance spatial utilization of the cube satellite which needs to mount various components in a limited size using the solar cell integrated with the radio wave transceiving apparatus.

The effects of the present disclosure are not limited to the aforementioned effects, and other effects, which are not mentioned above, will be apparent to a person having ordinary skill in the art from the following description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
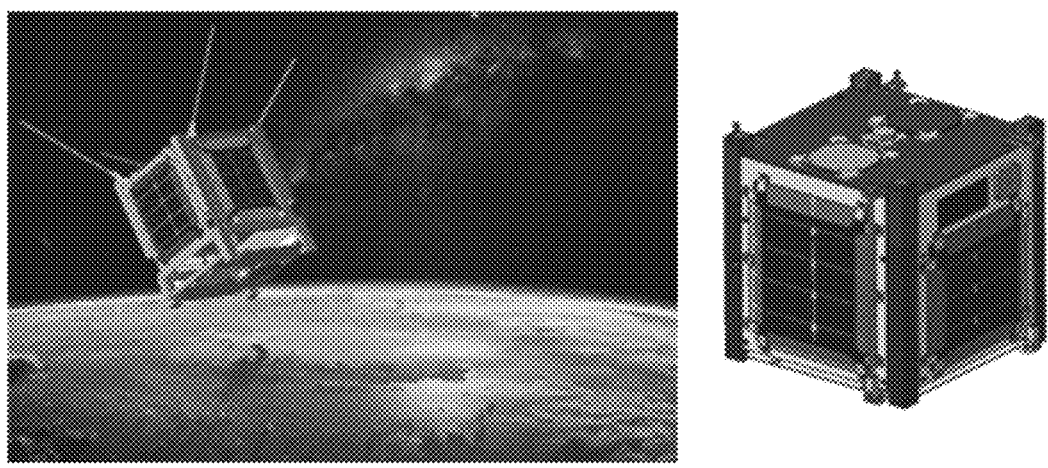
FIG. 1 is a diagram for describing integration of a radio wave transceiving apparatus with a solar cell in a cube satellite in the related art.

The present disclosure may have various modifications and various exemplary embodiments, and specific exemplary embodiments will be illustrated in drawings and described in detail in the detailed description. However, it should be understood that the present disclosure is not limited to specific exemplary embodiments, and the present disclosure covers all the modifications, equivalents and replacements included within the spirit and the technical scope of the present disclosure. In the description of each drawing, like reference numerals are used for like components.

Terms such as first, second, A, B, and the like may be used to describe various components, but the components should not be limited by the terms. The terms are used only for distinguishing one component from another component. For example, a first component may be referred to as a second component and similarly, the second component may also be referred to as the first component without departing from the scope of the present disclosure. A term 'and/or' includes a combination of a plurality of associated disclosed items or any item of the plurality of associated disclosed items.

It should be understood that, when it is described that a component is "connected to" or "accesses" another component, the component may also be directly connected to or access another component, but other components may also be present therebetween. In contrast, it should be understood that, when it is described that a component is "directly connected to" or "directly access" another component, other components are not present therebetween.

Terms used in the present application are used only for describing specific exemplary embodiments, and are not intended to limit the present disclosure. Singular expressions used herein include plurals expressions unless otherwise the context clearly implies. In the present application, it should be understood that term "comprising" or "having" indicates that features, numbers, steps, operations, components, parts or combinations thereof described in the specification are present, but a possibility of presence or addition of one or more other features, numbers, steps, operations, components, parts or combinations thereof is not excluded in advance.

Unless otherwise defined, all terms used herein including technological or scientific terms have the same meaning as those generally understood by a person with ordinary skill in the art. Terms defined in commonly used dictionaries should be construed to have meanings matching those in the context of the relevant art, and should not be construed as ideal or excessively formal meanings unless clearly defined in the present application.

Hereinafter, preferred exemplary embodiments of the present disclosure will be described in detail with reference to the accompanying drawings.

FIG. 1 is a diagram for describing integration of a radio wave transceiving apparatus with a solar cell of a cube satellite in the related art.

The cube satellite illustrated in FIG. 1 has a shape in which four radio wave transceiving apparatuses are attached to a square body and the size of the body is 1 U (10 cm×10 cm×10 cm). As illustrated in FIG. 1, the cube satellite needs to be mounted with a solar cell, a radio wave transceiving apparatus, an optical sensor, a camera lens, and a propulsion system on a limited area.

To this end, various efforts for integrating the radio wave transceiving apparatus with the solar cell have been made. The radio wave transceiving apparatus is used as a transparent conductor or also constituted as a footprint antenna or a mesh patch antenna. However, most of the currently proposed designs cannot guarantee 100% of an amount of solar radiation. That is, the radio wave transceiving apparatus affects energy harvesting of the solar cell.

In order to solve such problems, the present disclosure proposes an integrated structure of the radio wave transceiving apparatus and the solar cell, in which the solar cell and the radio wave transceiving apparatus can more effectively share a limited surface area. The integrated structure with the solar cell may vary according to a shape of the radio wave transceiving apparatus used at this time.

Figure 2A:
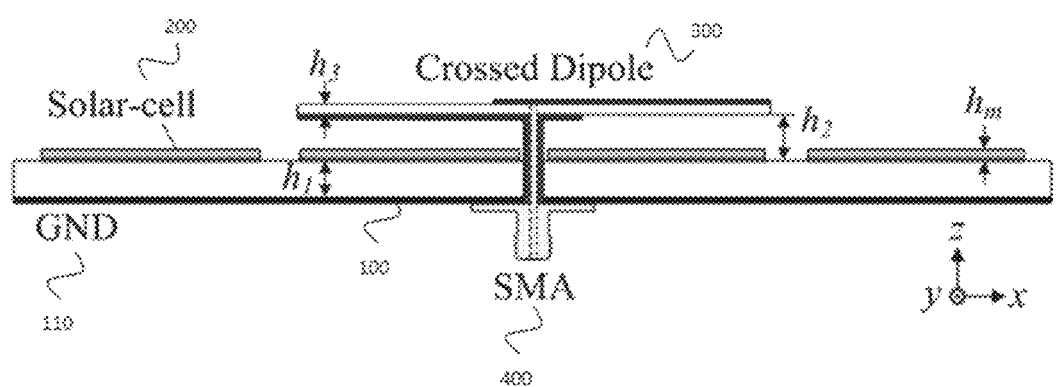
FIGS. 2A and 2B are a side view and a plan view for describing a solar cell integrated with a crossed dipole type radiator according to an exemplary embodiment of the present disclosure.
Figure 2B:
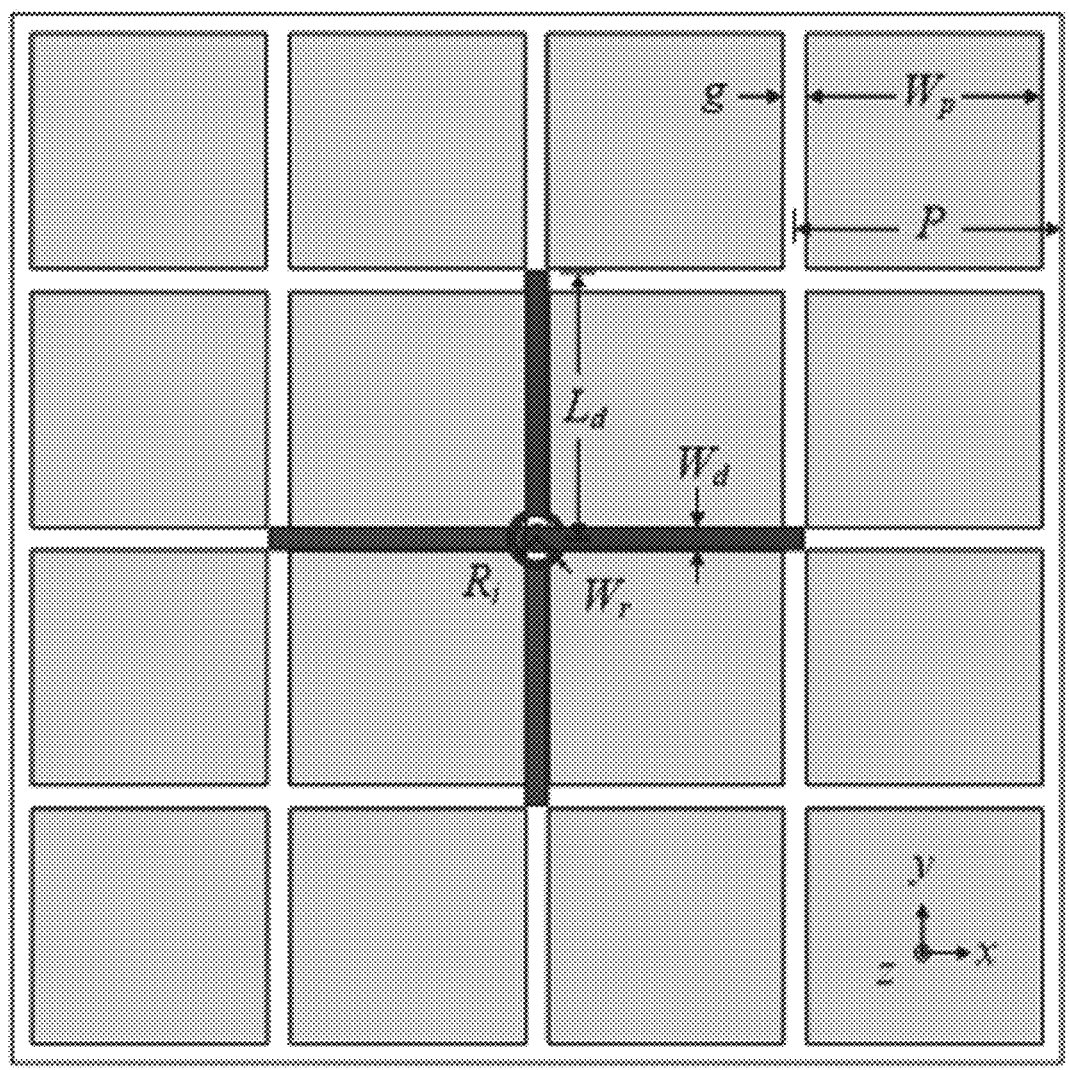

FIGS. 2A and 2B are a side view and a plan view for describing a solar cell integrated with a crossed dipole type radiator according to an exemplary embodiment of the present disclosure.

Referring to FIG. 2A, a solar cell integrated with a crossed dipole type radiator according to an exemplary embodiment of the present disclosure may include a substrate 100, a solar cell 200, a crossed dipole type radiator 300, a power feeding unit 400, and the like.

Referring to FIG. 2A, a height of the substrate 100 is illustrated as h1. Further, a plurality of solar cells 200 is bonded onto the substrate 100 and a ground surface 110 may further be included on the lower portion thereof. In addition, the power feeding unit 400 that is connected to the crossed dipole type radiator 300 to transmit a signal is positioned at the center of the substrate 100.

Herein, the substrate 100 may be made of a dielectric material, preferably, a material having a high dielectric constant. In this case, the dielectric material which may be used as the material of the substrate 100 may include all dielectric materials which are generally used in the art, such as epoxy, duroid, teflon, bakelite, high-resistance silicon, glass, alumina, LTCC, and air foam.

Referring to FIG. 2A, a height of the plurality of solar cells 200 is illustrated as hm. The plurality of solar cells 200 is bonded onto the substrate 100 and periodically arranged in a form of 4×4. The arrangement of the plurality of solar cells 200 will be described in more detail in FIG. 3.

Referring to FIG. 2A, the crossed dipole type radiator 300 is positioned above the upper portion of the substrate 100 by a height h2 and a height of the crossed dipole type radiator 300 is illustrated as h3. A power feeding hole at the center of the crossed dipole type radiator 300 is connected with an inner side of the power feeding unit 400.

Referring to FIG. 2A, the power feeding unit 400 may further include an inner side and an outer side. The inner side of the power feeding unit 400 is electrically connected with the power feeding hole of the crossed dipole type radiator 300 through the substrate 100 and the outer side of the power feeding unit 400 may be electrically connected with the ground surface 110.

Referring to FIG. 2B, the solar cell 200 may be constituted by a plurality of solar cells. Preferably, the plurality of solar cells may be arranged on the substrate 100 in a regular lattice shape of 4×4. At this time, a gap between the solar cells is g, and one solar cell may be a square shape having horizontal and vertical lengths of Wp.

Particularly, the solar cells 200 regularly arranged form a metasurface structure made of a metamaterial to enhance the performance of the radio wave transceiving apparatus.

Herein, the metamaterial refers to a material designed to have a characteristic which is not yet found in nature. The metamaterial consists of an aggregate of complex elements made of a general material such as plastic and metal. The material is usually arranged in repeating patterns.

The characteristics of the metamaterial are caused by the structure thereof other than the characteristics of a base material. An accurate shape, a geometric structure, a size, a direction, and an arrangement of the metamaterial determine the characteristics of the metamaterial. The metamaterial properly designed may interfere with electromagnetic waves or sounds in a form in which an object is not observed.

The characteristics of a metamaterial having a negative refractive index at a specific wavelength cause many experiments. These materials are known as 'negative index metamaterials'. The metamaterials may be applied in a wide variety of fields, such as aerospace industry, sensor sensing and infrastructure monitoring, smart solar energy management, crowd control, radome, high frequency communications in warfare, high gain antenna lenses, improvement of ultrasonic sensors, and earthquake damage prevention buildings.

Due to the above characteristics, electromagnetic waves in the metamaterials are transmitted by Fleming's left-hand rule without following Fleming's right-hand rule. That is, a phase propagation direction (phase velocity) and an energy transfer direction (group velocity) of the electromagnetic wave are opposite to each other, and a signal passing through the metamaterial has a negative phase delay. Accordingly, the metamaterial is referred to as a left-handed material (LHM).

In the case of the metamaterials, a relationship between $\beta$ (phase constant) and $\omega$ (frequency) is nonlinear, and a characteristic curve thereof is present even in a left half plane of a coordinate plane. Due to such a nonlinear characteristic, the metamaterial may be implemented as a broadband circuit because a phase difference is small according to a frequency, and implemented as a small-sized circuit because the phase change is not proportional to the length of a transmission line.

According to an exemplary embodiment of the present disclosure, each solar cell may form a lattice structure having a periodicity P with a gap g having a predetermined size. A broadband circularly polarized radio wave transceiving apparatus using the metasurface according to the exemplary embodiment of the present disclosure exhibits a low profile in a CubeSat S band, broadband impedance matching, and a circular polarization characteristic.

The solar cell integrated with the radio wave transceiving apparatus according to the exemplary embodiment of the present disclosure may be implemented using a Rogers RO4003 material as the substrate 100 (r=3.38, tan $\delta$=0.0027, h1=3.86 mm). In addition, the crossed dipole type radiator may also be implemented by printing the Rogers RO4003 material on both surfaces of the substrate (r=3.38, tan $\delta$=0.0027, h3=0.508 mm).

In addition, in a side view and a plan view of FIGS. 2A and 2B, it was confirmed that the solar cell integrated with the crossed dipole type radiator according to the exemplary embodiment of the present disclosure had an optimized characteristic when h1=3.8608 mm, h2=1.5 mm, h3=0.508 mm, hm=0.4 mm, P=25.0 mm, Wp=24.0 mm, g=1.0 mm, Ld=26 mm, Wd=1.0 mm, Ri=2.8 mm, and Wr=0.4 mm. In particular, the crossed dipole type radiator 300 may achieve 100% of the solar radiation amount of the solar cell by designing a dipole arm Wd to have the same length as the gap g between the solar cells.

Figure 3A:
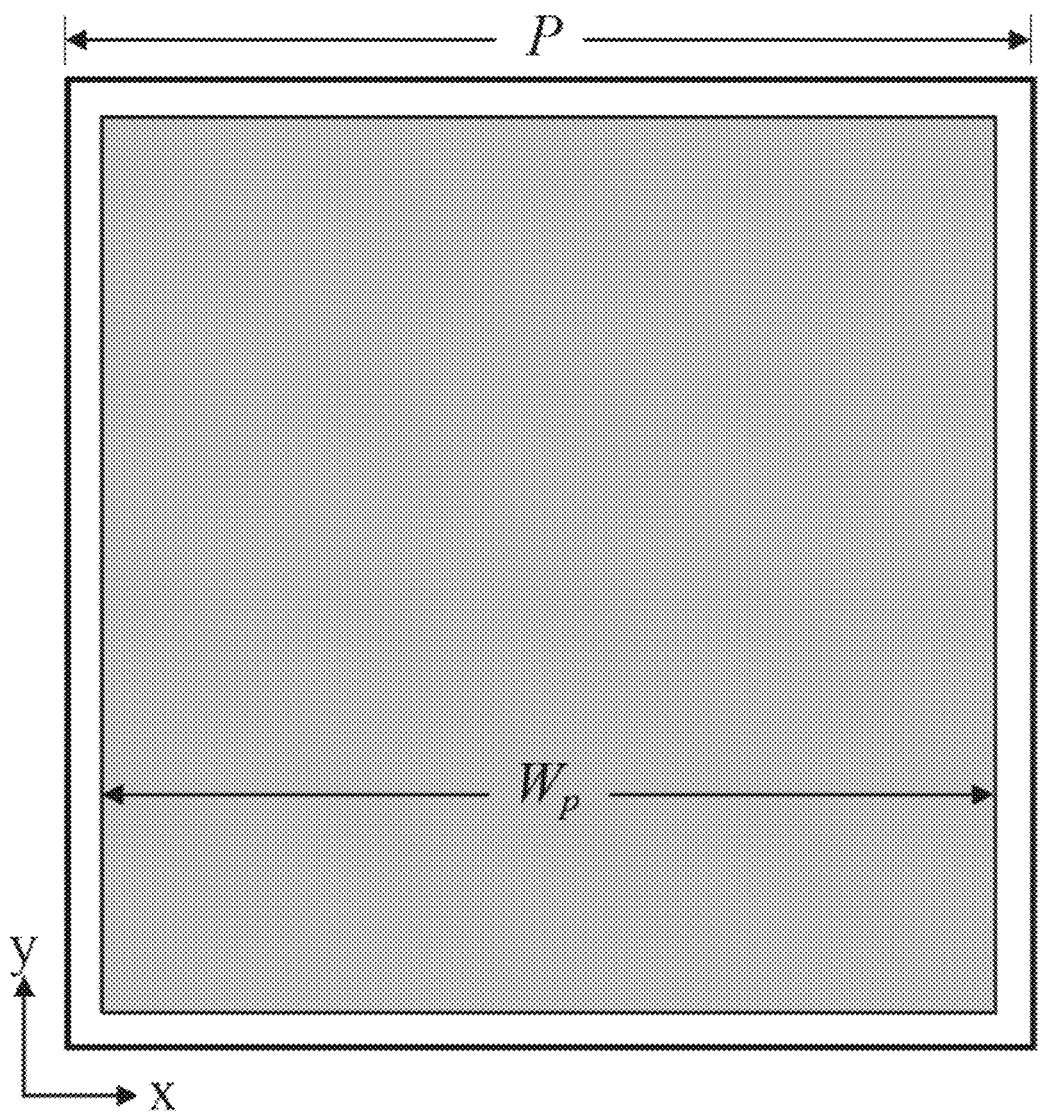
FIGS. 3A and 3B are a side view and a plan view for describing integration of a substrate with the solar cell used in the exemplary embodiment of the present disclosure.
Figure 3B:
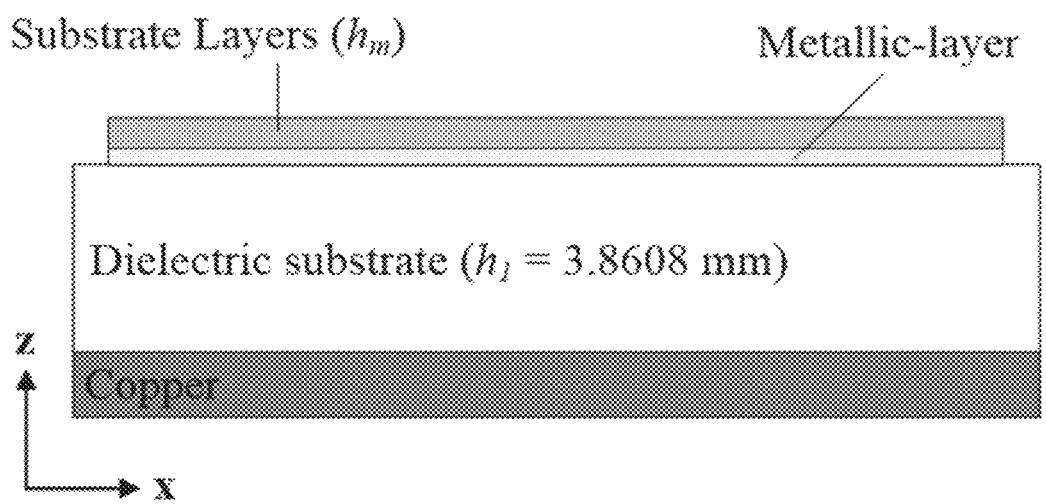

FIGS. 3A and 3B are a side view and a plan view for describing integration of the substrate with the solar cell used in the exemplary embodiment of the present disclosure.

Referring to FIG. 3A, the solar cells 200 are arranged on the substrate 100 in a lattice structure to have a periodicity P. In addition, referring to FIG. 3B, the solar cell 200 constituting the metasurface may be constituted by bonding substrate layers 210 of the solar cell having a height hm on a metallic layer 220.

Figure 4:
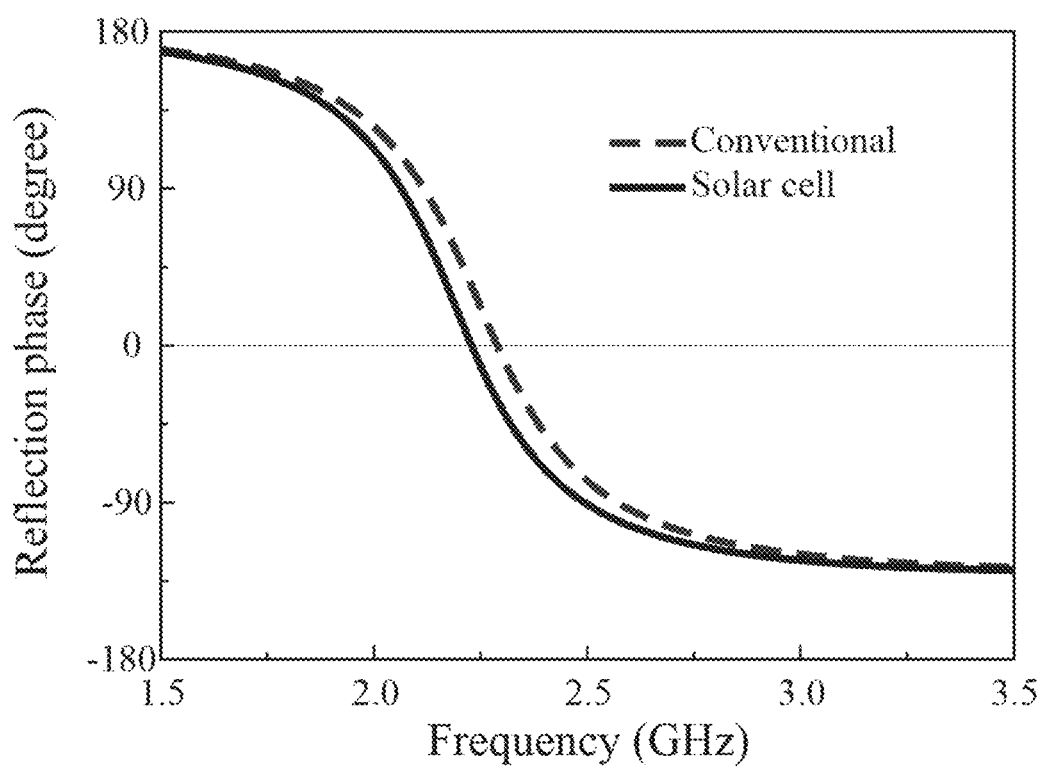
FIG. 4 is a diagram for describing a phase distribution when the solar cell integrated with the crossed dipole type radiator according to the exemplary embodiment of the present disclosure constitutes a metasurface.

FIG. 4 is a diagram for describing a phase distribution when the solar cell integrated with the crossed dipole type radiator according to the exemplary embodiment of the present disclosure constitutes a metasurface.

Referring to FIG. 4, when the metasurface is implemented only by the metallic layer 220, the metasurface is represented by red. That is, in FIG. 3B, when the metasurface is constituted only by the metallic layer 220 without the layers 210 of the solar cell, the metasurface is represented by red. In contrast, as illustrated in FIG. 3B, when the layers 210 of the solar cell is bonded onto the metallic layer 220 as illustrated in FIG. 3B, the metasurface is represented by blue.

Compared to a case where there are no layers 210 of the solar cell (Conventional), in the case of constituting the metasurface by further bonding the layers 210 of the solar cell (Solar cell), a resonant frequency moved to a lower level.

Referring to FIG. 4, when there are no layers 210 of the solar cell (red), resonance occurs at 2.29 GHz with respect to a 0° reflection phase. In contrast, in the case of constituting the metasurface by further bonding the layers 210 of the solar cell (blue), there is a difference in that the resonance occurs at 2.23 GHz with respect to the 0° reflection phase.

In addition, in the case of constituting the metasurface by further bonding the layers 210 of the solar cell (blue), a ±90° reflection phase in a bandwidth of 2.06 to 2.49 GHz covering the entire CubeSat S band can be made. As such, even though the solar cells 200 are further used to constitute the metasurface, the low profile and the broadband characteristic may be equally secured.

Figure 5A:
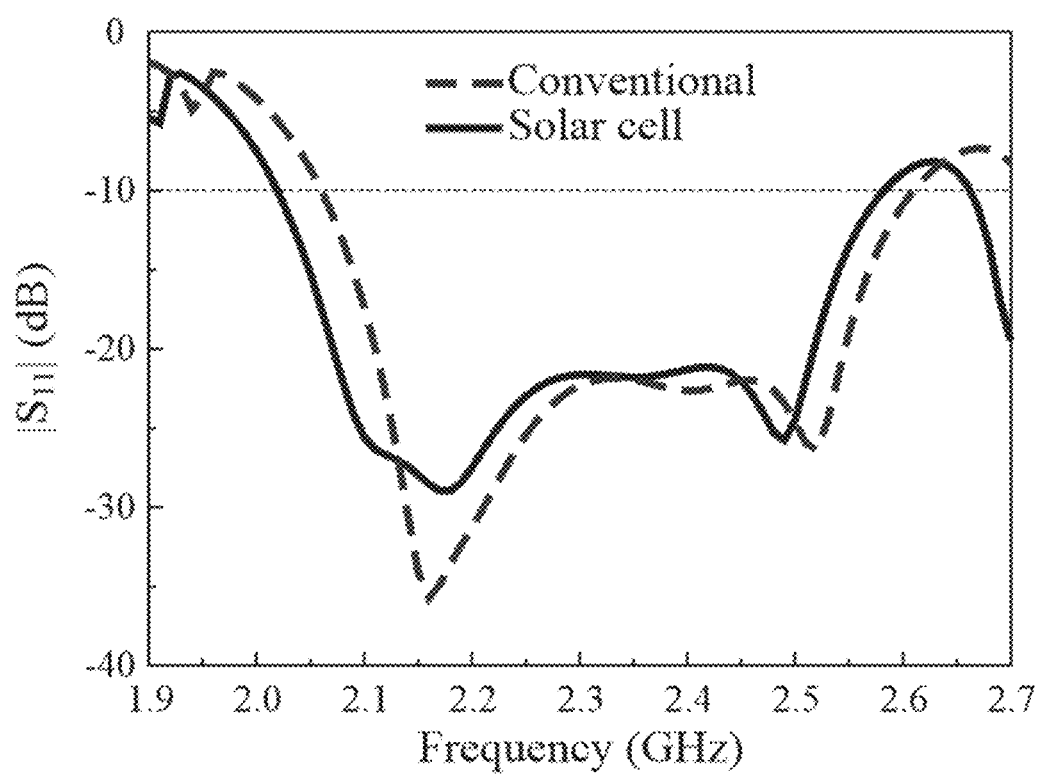
FIG. 5A is a graph illustrating a simulation result for describing a reflection coefficient characteristic when the solar cell integrated with the crossed dipole type radiator according to the exemplary embodiment of the present disclosure constitutes the metasurface.

FIG. 5A is a graph illustrating a simulation result for describing a reflection coefficient characteristic when the solar cell integrated with the crossed dipole type radiator according to the exemplary embodiment of the present disclosure constitutes the metasurface. In addition, FIG. 5B is a graph illustrating a simulation result for describing an axial ratio characteristic when the solar cell integrated with the crossed dipole type radiator according to the exemplary embodiment of the present disclosure constitutes the metasurface.

In order to be able to operate as the radio wave transceiving apparatus, a reflection coefficient is preferably −10 dB or less, and when the reflection coefficient exceeds −10 dB, the performance of the radio wave transceiving apparatus is generally deteriorated. At this time, if an axial ratio is 3 dB or less in the frequency band corresponding to the reflection coefficient of −10 dB or less, it can be seen that the circularly polarized characteristic is exhibited.

Figure 5B:
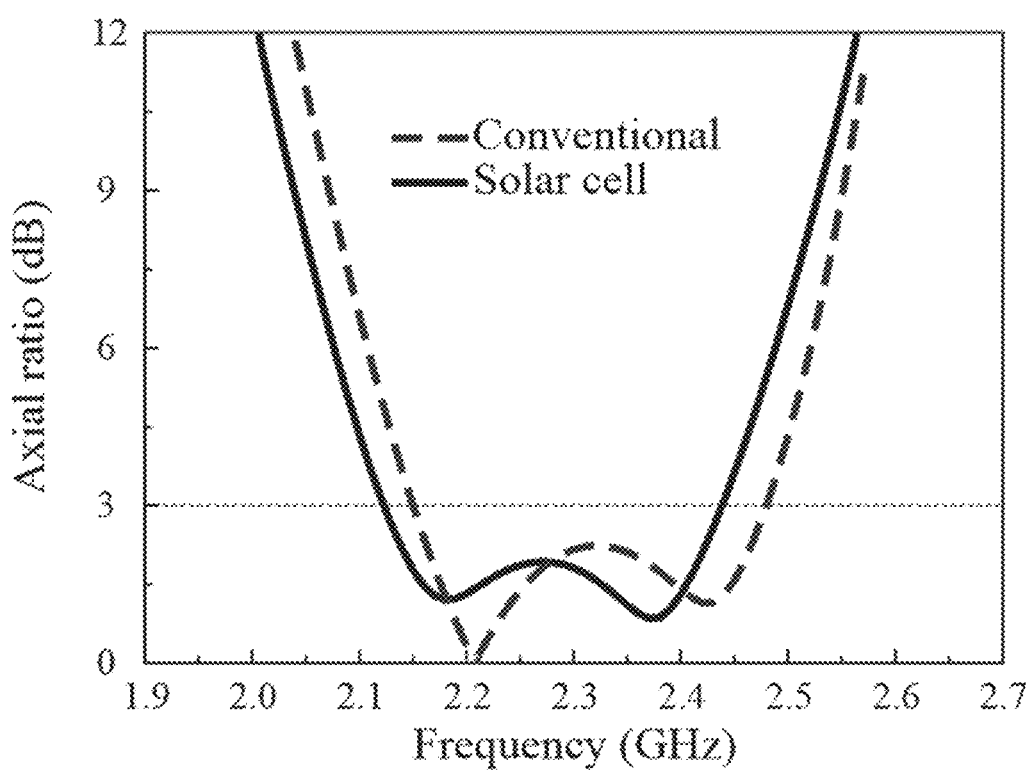
FIG. 5B is a graph illustrating a simulation result for describing an axial ratio characteristic when the solar cell integrated with the crossed dipole type radiator according to the exemplary embodiment of the present disclosure constitutes the metasurface.

Referring to FIGS. 5A and 5B, in both cases where there are no layers 210 of the solar cell (red) and where the metasurface is constituted by further bonding the layers 210 of the solar cell (blue), it can be seen that the axial ratio is 3 dB or less in the frequency band corresponding to the reflectance coefficient of −10 dB or less. That is, it can be confirmed that the characteristics due to the metasurface are generated in the both cases of constituting the metasurface only by the metallic layer 220 and constituting the metasurface by further bonding the layers 210 of the solar cell onto the metallic layer 220.

More specifically, when the metasurface is constituted only by the metallic layer 220 (red), the reflection coefficient bandwidth of −10 dB or less was measured as 2.17 to 2.60 GHz, and the axial ratio bandwidth of 3 dB or less was measured as 2.15 to 2.48 GHz. In addition, the metasurface has a minimum axial ratio of 0.1 dB at 2.21 GHz and a minimum axial ratio of 1.14 dB at 2.42 GHz.

In contrast, it can be seen that when the metasurface is constituted by further bonding the layers 210 of the solar cell (blue), the resonant frequency and the minimum axial ratio frequency moved to the lower levels.

More specifically, when the metasurface is constituted by further bonding the layers 210 of the solar cell (blue), the reflection coefficient bandwidth of −10 dB or less was measured as 2.02 to 2.58 GHz, and the axial ratio bandwidth of 3 dB or less was measured as 2.12 to 2.44 GHz. In addition, the metasurface has a minimum axial ratio of 1.2 dB at 2.18 GHz and a minimum axial ratio of 0.84 dB at 2.37 GHz. This fully covers the CubeSat S bandwidth.

Figure 6A:
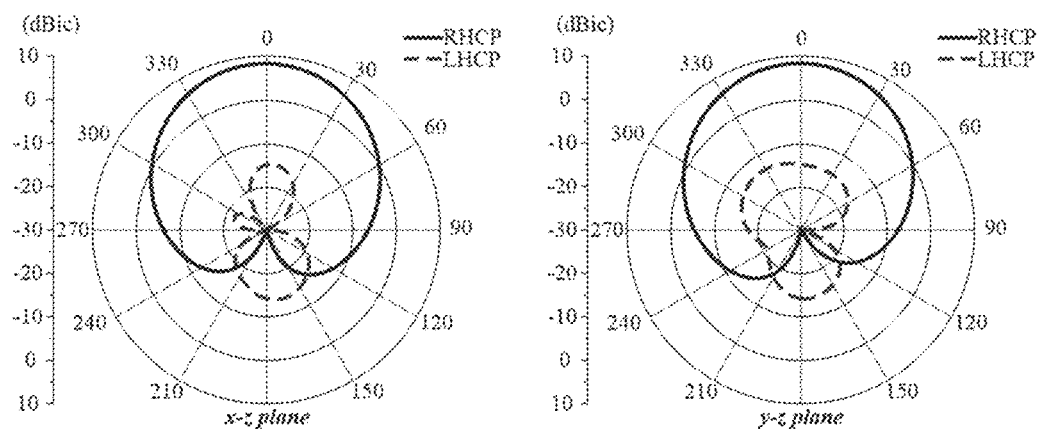
FIG. 6A is a simulation and a measured radiation pattern at 2.18 GHz of the solar cell integrated with the crossed dipole type radiator according to the exemplary embodiment of the present disclosure.

FIG. 6A is a simulation and a measured radiation pattern at 2.18 GHz of the solar cell integrated with the crossed dipole type radiator according to the exemplary embodiment of the present disclosure. In addition, FIG. 6B is a simulation and a measured radiation pattern at 2.38 GHz of the solar cell integrated with the crossed dipole type radiator according to the exemplary embodiment of the present disclosure.

Referring to FIG. 6A, at 2.18 GHz, a gain of the measured circularly polarized wave was 8.22 dBic, a front-to-rear ratio was 22.32 dB, and a half power beam width (HPBW) was 68° in an x-z plane and 69° in a y-z plane.

Figure 6B:
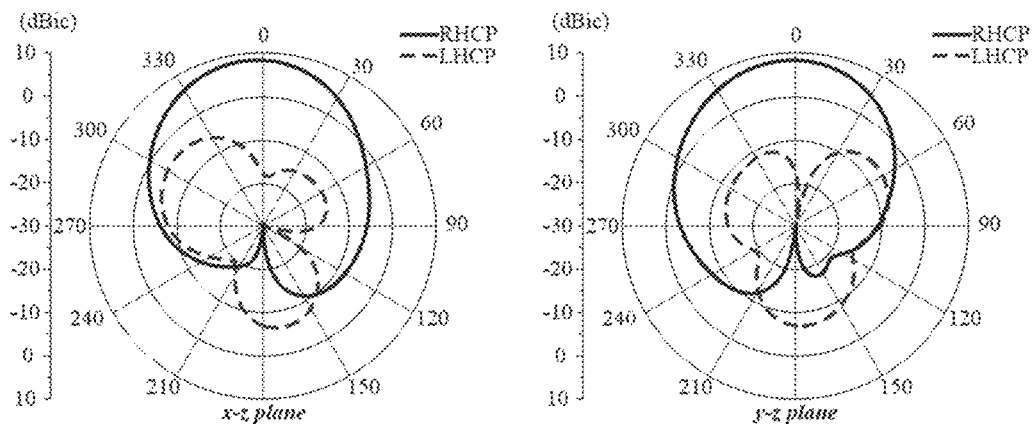
FIG. 6B is a simulation and a measured radiation pattern at 2.38 GHz of the solar cell integrated with the crossed dipole type radiator according to the exemplary embodiment of the present disclosure.

Referring to FIG. 6B, at 2.38 GHz, a gain of the measured circularly polarized wave was 8.32 dBic, a front-to-rear ratio was 15.25 dB, and a half power beam width (HPBW) was 59° in an x-z plane and 63° in a y-z plane. In addition, the radiation efficiency was 90% or more within the operating bandwidth.

As the number of unit cells increases, a minimum axial ratio point generated by the induction patch slightly changes. When the unit cells are arranged in 4×4 in the lattice structure, the best result may be obtained when considering the axial ratio bandwidth of 3 dB or less.

Hereinabove, the solar cell integrated with the crossed dipole type radio wave transceiving apparatus proposed by the present disclosure has been described with reference to FIGS. 2A to 6B. In particular, since the solar cell 200 has the metasurface structure, it can be seen that the solar cell 200 exhibits a broadband characteristic of the low profile.

Also, the volume of the solar cell and the radio wave transceiving apparatus can be optimized by bonding the crossed dipole type radiator 300 for radio wave transceiving onto the solar cell 200 constituting the metasurface.

The metasurface formed by the solar cell 200 according to the exemplary embodiment of the present disclosure is a reactive impedance surface (RIS) structure. In general, the RIS structure is formed of a square metal plate lattice formed on a dielectric substrate. It can be seen that the impedance matching and the circular polarization characteristics are greatly improved by the metasurface.

A largely increase in the bandwidth of the circularly polarized radio wave transceiving apparatus using the metasurface according to the exemplary embodiment of the present disclosure may be described by an effect of a surface wave propagated from an RIS-based radio wave transceiving apparatus having a limited size. That is, additional resonance due to the surface wave occurs at a specific frequency, and as a result, the performance of the radio wave transceiving apparatus is improved.

Analysis and modeling of the surface wave resonance in the RIS-based radio wave transceiving apparatus are theoretically and computationally known. The surface wave propagated from the metasurface having the limited size improves the bandwidth of the radio wave transceiving apparatus having the crossed dipole type radiator by the additional resonance.

In addition, it is possible to sufficiently secure the solar radiation amount of the solar cell 200 and to minimize the shadow caused by the crossed dipole type radiator 300 even though the crossed dipole type radiator 300 is integrated with the solar cell 200.

As described above, in addition to the solar cell integrated with the crossed dipole type radiator proposed in the present disclosure, the integrated structure with the solar cell may be variously varied according to a shape of the radiator. For example, when the shape of the radiator is a circularly polarized patch structure, the radiator may be bonded between the ground surface 110 and the solar cell 200 in a sandwich structure in order to minimize the shadow caused by the radiator.

Figure 7A:
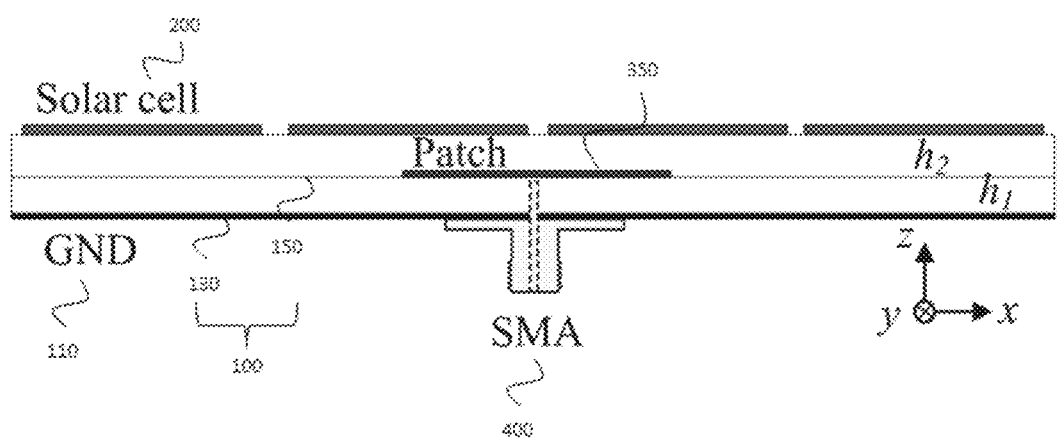
FIGS. 7A and 7B are a side view and a plan view for describing a solar cell integrated with a circularly polarized patch type radiator according to an exemplary embodiment of the present disclosure.
Figure 7B:
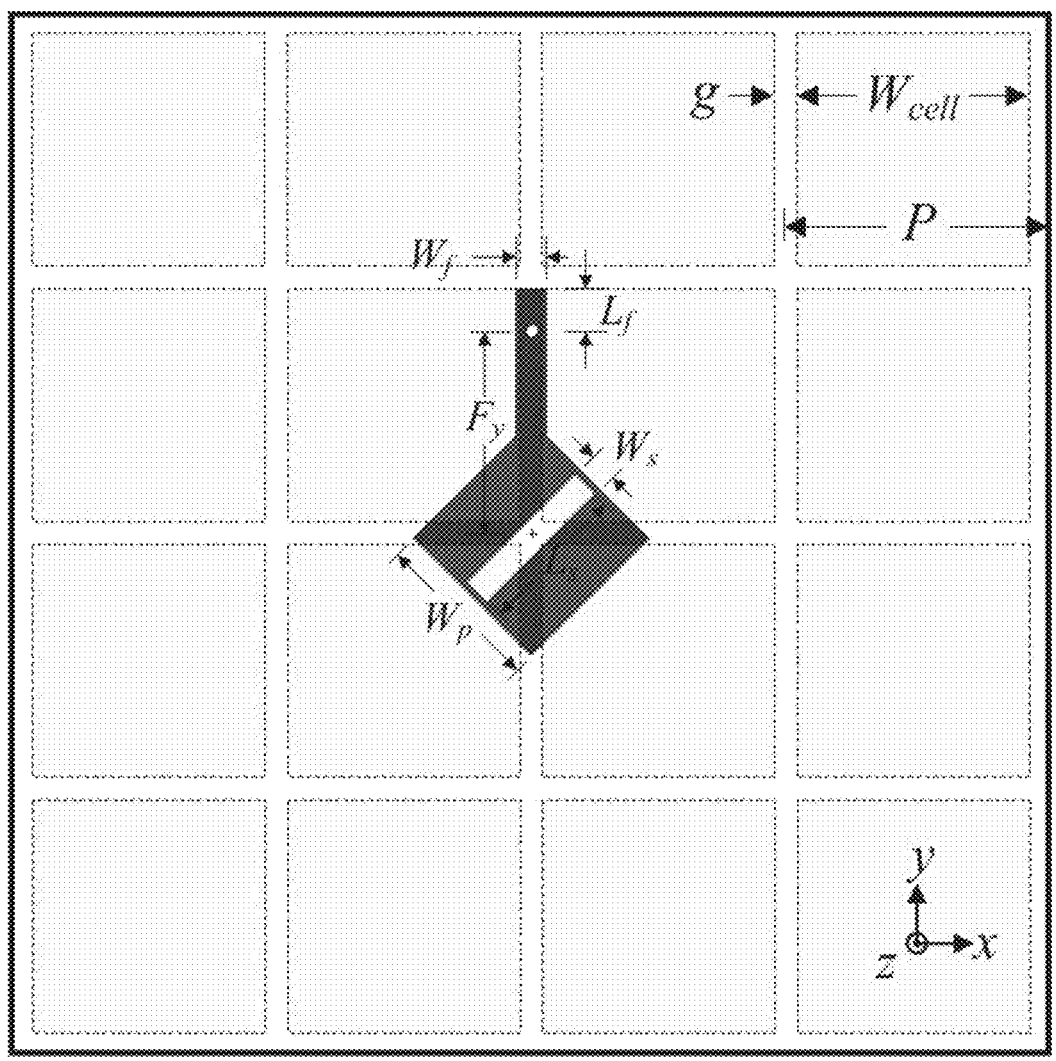

FIGS. 7A and 7B are a side view and a plan view for describing a solar cell integrated with a circularly polarized patch type radiator according to an exemplary embodiment of the present disclosure.

Referring to FIG. 7A, it can be seen that the substrate 100 is formed by bonding a lower substrate 130 and an upper substrate 150, that is, two substrates, unlike the case of FIG. 2A. It can also be seen that a circularly polarized patch type radiator 350 is bonded between the lower substrate 130 and the upper substrate 150 in a sandwich structure.

As illustrated in FIG. 2A, the crossed dipole type radiator 300 may be designed to have a dipole arm having the same width as the gap between the solar cells to increase the solar radiation amount of the solar cell. However, since the circularly polarized patch type radiator 350 cannot be designed as such, the circularly polarized patch type radiator 350 is bonded between the lower substrate 130 and the upper substrate 150 in a sandwich structure in order to minimize the shadow.

The upper substrate 150 and the lower substrate 130 may use a dielectric substrate formed of a dielectric material, and preferably, may be formed of a material having a high dielectric constant. Here, the upper substrate 150 and the lower substrate 130 are classified according to a relative position therebetween, and may be formed of the same material or different materials, but it is preferred that the shapes and the areas in plane are the same as each other.

Referring to FIG. 7A, the upper substrate 150 and the lower substrate 130 have widths, lengths, and heights, and square pillar shapes in which the width and the length are larger than the height and sizes of the width and the length are the same as each other. At this time, the lower substrate 130 has a height of h1 and the upper substrate 150 has a height of h2.

It is preferred that the upper substrate 150 is stacked on the upper surface of the lower substrate 130 without an air gap for a low height and easy fabrication. The radiator 300 may be used as a microstrip patch type driven patch and positioned between the upper substrate 150 and the lower substrate 130 and preferably, formed on the upper surface of the lower substrate 130.

Referring to FIG. 7B, the shape of the circularly polarized patch type basic radiator 350 is a rectangle, preferably a square. In the drawing, the sizes of the width and the length of the radiator 350 are illustrated as Wp and the center of the radiator 350 may be determined based on a basic shape of the radiator 350.

Figure 10:
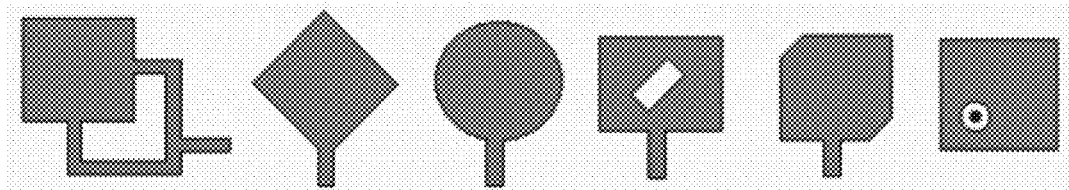
FIG. 10 is a diagram illustrating the circularly polarized patch type which may be used in the exemplary embodiment of the present disclosure.

However, the circularly polarized patch type radiator 350 may have various shapes other than the shape of FIG. 7B, and is not necessarily limited to the shape of FIG. 7B. For example, in FIG. 7B, a square-shaped circularly polarized patch having a slot is illustrated, but circularly polarized patch type radiators 350 having various shapes may be used as illustrated in FIG. 10.

Instead, in the case of using the circularly polarized patch type radiator 350, the circularly polarized patch type radiator 350 is positioned between the lower substrate 130 and the upper substrate 150 constituting the substrate 100 to enhance the efficiency of the radio wave transceiving apparatus and increase the solar radiation amount of the solar cell.

In addition, in the side view and the plan view of FIGS. 7A and 7B, it was confirmed that the solar cell integrated with the circularly polarized patch type radiator according to the exemplary embodiment of the present disclosure had an optimized characteristic when P=25 mm, g=1.0 mm, Wcell=24 mm, h1=h2=1.524 mm, Wp=16 mm, Ls=15 mm, Ws=3 mm, Wf=3 mm, Lf=3 mm, and Fy=19.5 mm.

Hereinafter, characteristics of the radio wave transceiving apparatus in the case of using the square-shaped circularly polarized patch having the slot as the radiator 350 will be described with reference to FIGS. 8A to 9B like FIGS. 7A and 7B.

Figure 8A:
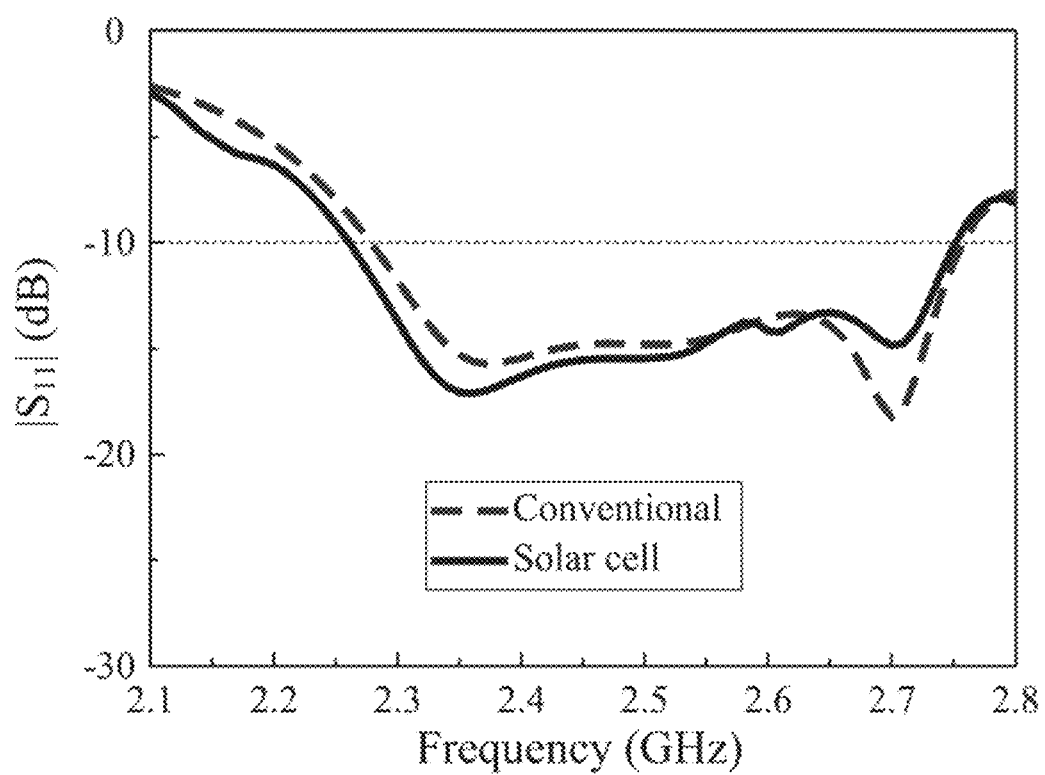
FIG. 8A is a graph illustrating a simulation result for describing a reflection coefficient characteristic when the solar cell integrated with the circularly polarized patch type radiator according to the exemplary embodiment of the present disclosure constitutes a metasurface.
Figure 8B:
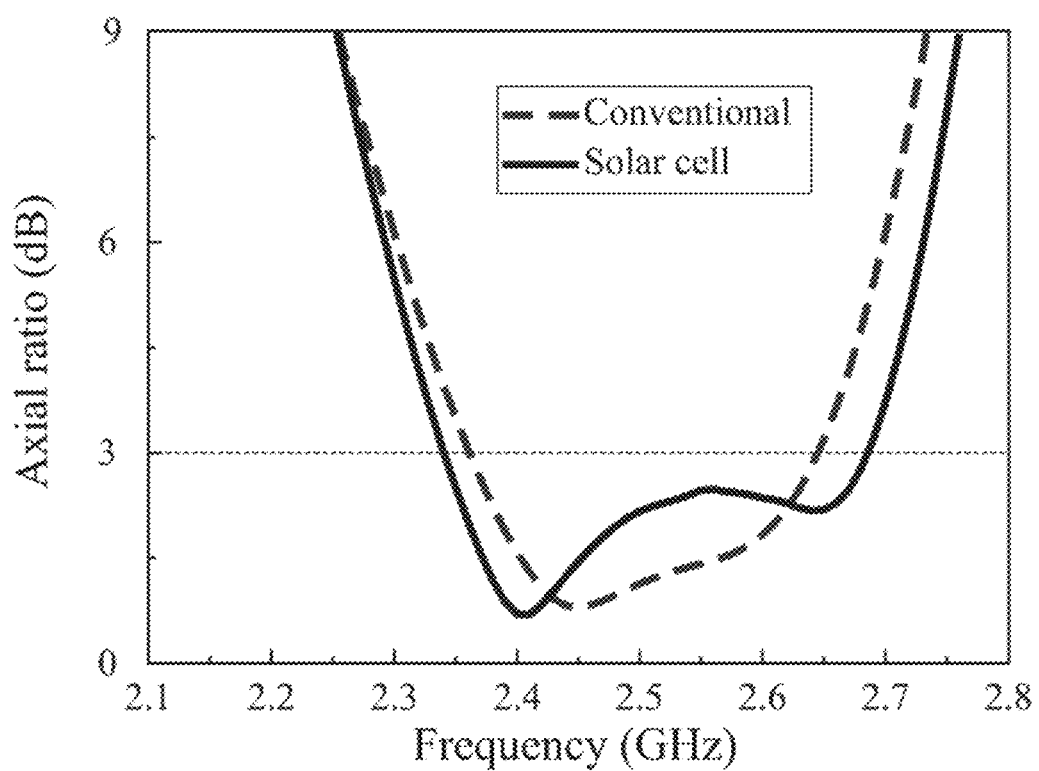
FIG. 8B is a graph illustrating a simulation result for describing an axial ratio characteristic when the solar cell integrated with the circularly polarized patch type radiator according to the exemplary embodiment of the present disclosure constitutes the metasurface.

FIG. 8A is a graph illustrating a simulation result for describing a reflection coefficient characteristic when the solar cell integrated with the circularly polarized patch type radiator according to the exemplary embodiment of the present disclosure constitutes a metasurface. In addition, FIG. 8B is a graph illustrating a simulation result for describing an axial ratio characteristic when the solar cell integrated with the circularly polarized patch type radiator according to the exemplary embodiment of the present disclosure constitutes the metasurface. In addition, FIG. 8C is a graph illustrating a simulation result for describing a broadside gain characteristic when the solar cell integrated with the circularly polarized patch type radiator according to the exemplary embodiment of the present disclosure constitutes the metasurface.

Figure 8C:
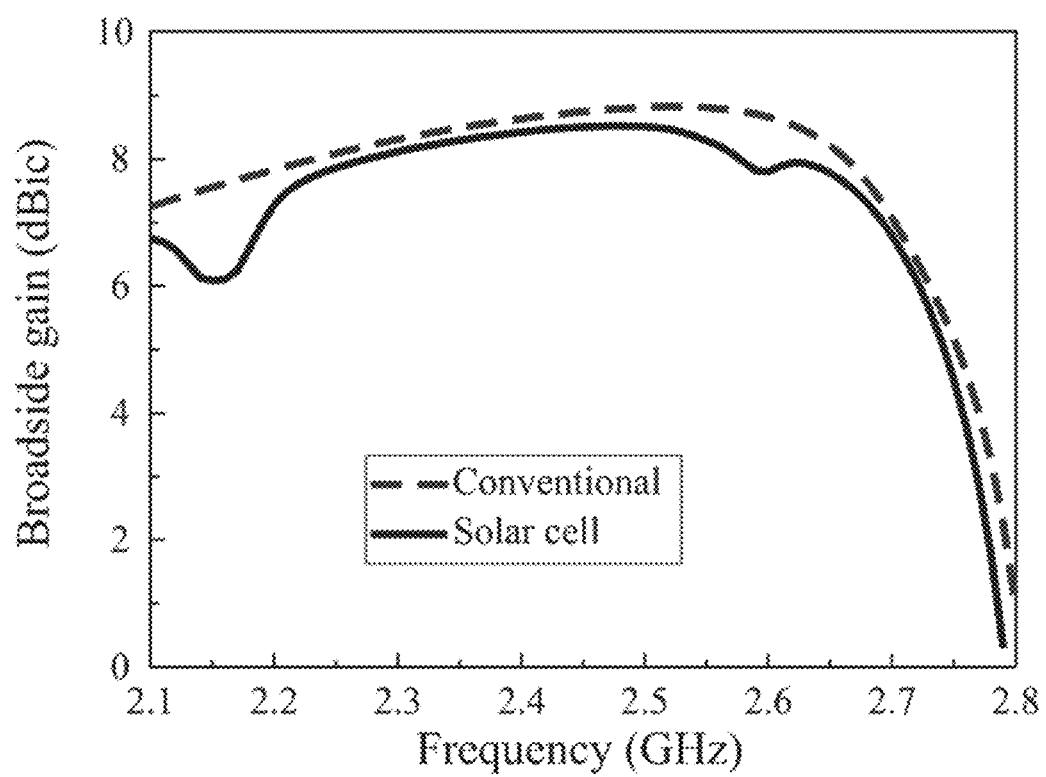
FIG. 8C is a graph illustrating a simulation result for describing a broadside gain characteristic when the solar cell integrated with the circularly polarized patch type radiator according to the exemplary embodiment of the present disclosure constitutes the metasurface.

Referring to FIGS. 8A and 8C, in both cases where there are no layers 210 of the solar cell (red) and where the metasurface is constituted by further bonding the layers 210 of the solar cell (blue), it can be seen that the axial ratio is 3 dB or less in the frequency band corresponding to the reflectance coefficient of −10 dB or less.

More specifically, when the metasurface is constituted only by the metallic layer 220 (red), the reflection coefficient bandwidth of −10 dB or less was measured as 2.28 to 2.75 GHz, and the axial ratio bandwidth of 3 dB or less was measured as 2.36 to 2.64 GHz. In addition, it can be seen that a broadside gain of 8.22 to 8.83 dBic is obtained.

In contrast, when the metasurface is constituted by further bonding the layers 210 of the solar cell (blue), the reflection coefficient bandwidth of −10 dB or less was measured as 2.27 to 2.75 GHz, and the axial ratio bandwidth of 3 dB or less was measured as 2.34 to 2.68 GHz. In addition, it can be seen that a broadside gain of 7.3 to 8.5 dBic is obtained.

Figure 9A:
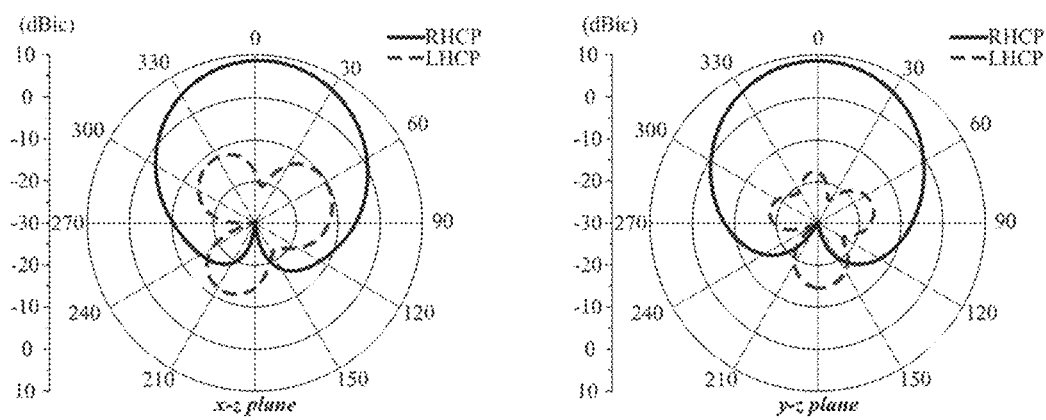
FIG. 9A is a simulation and a measured radiation pattern at 2.4 GHz of the solar cell integrated with the circularly polarized patch type radiator according to the exemplary embodiment of the present disclosure.

FIG. 9A is a simulation and a measured radiation pattern at 2.4 GHz of the solar cell integrated with the circularly polarized patch type radiator according to the exemplary embodiment of the present disclosure. In addition, FIG. 9B is a simulation and a measured radiation pattern at 2.6 GHz of the solar cell integrated with the circularly polarized patch type radiator according to the exemplary embodiment of the present disclosure.

Referring to FIG. 9A, at 2.4 GHz, a gain of the measured circularly polarized wave was 8.6 dBic, a front-to-rear ratio was 22.0 dB, and a half power beam width (HPBW) was 82° in an x-z plane and 85° in a y-z plane.

Figure 9B:
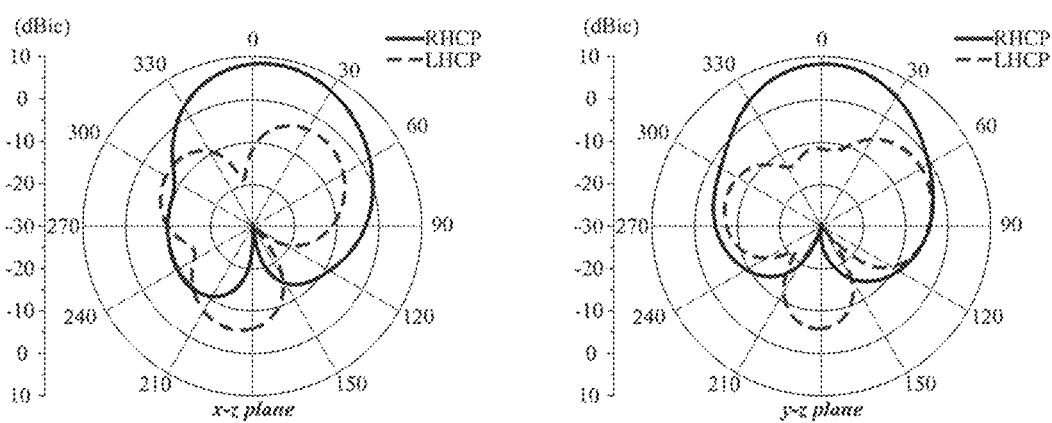
FIG. 9B is a simulation and a measured radiation pattern at 2.6 GHz of the solar cell integrated with the circularly polarized patch type radiator according to the exemplary embodiment of the present disclosure.

Referring to FIG. 9B, at 2.6 GHz, a gain of the measured circularly polarized wave was 8.3 dBic, a front-to-rear ratio was 18.0 dB, and a half power beam width (HPBW) was 68° in an x-z plane and 71° in a y-z plane. In addition, the radiation efficiency was 85% or more within the operating bandwidth.

Although the exemplary embodiments of the present disclosure were described above with reference to the accompanying drawings, it will be understood to those skilled in the art that the present disclosure may be implemented in other detailed ways without changing the technical spirit or required features. Therefore, it should be understood that the exemplary embodiments described above are illustrative and not limited in all aspects.

What is claimed is:

1. A solar cell integrated with a radio wave transceiving apparatus comprising:
   a substrate;
   a solar cell in which a plurality of unit cells is periodically arranged on the upper surface of the substrate to form a metasurface; and
   a crossed dipole type radiator positioned on the solar cell,
   wherein an arm of the crossed dipole type radiator has the same width as a gap disposed between the plurality of unit cells.

2. The solar cell according to claim 1, further comprising:
   a power feeding unit which is connected with a power feeding hole of the radiator to transmit a signal.

3. The solar cell according to claim 2, wherein a ground surface is formed on the lower surface of the substrate.

4. The solar cell according to claim 3, wherein an inner side of the power feeding unit is electrically connected with the power feeding hole of the radiator through the substrate, and an outer side of the power feeding unit is electrically connected with the ground surface.

5. The solar cell according to claim 1, wherein the solar cell is used for a cube satellite (CubeSat).

6. A solar cell integrated with a radio wave transceiving apparatus comprising:
   a substrate;
   a solar cell in which a plurality of unit cells is periodically arranged on the upper surface of the substrate to form a metasurface; and
   a crossed dipole type radiator positioned on the solar cell,
   wherein the plurality of unit cells is arranged in a lattice structure of 4×4, and
   a plurality of unit metallic cells having square shapes is arranged on the upper surface of the substrate in a lattice structure, and a solar cell having the same shape is stacked on the upper surface of each of the plurality of unit metallic cells.

7. A solar cell integrated with a radio wave transceiving apparatus comprising:
   a lower substrate;
   an upper substrate stacked on the lower substrate;
   a solar cell in which a plurality of unit cells is periodically arranged on the upper surface of the upper substrate to form a metasurface; and
   a circularly polarized patch type radiator positioned between the lower substrate and the upper substrate.

8. The solar cell according to claim 7, wherein the radiator has a slot therein.

9. The solar cell according to claim 7, wherein the plurality of unit cells is arranged in a lattice structure of 4×4.

10. The solar cell according to claim 9, wherein a plurality of unit metallic cells having square shapes is arranged on the upper surface of the upper substrate in a lattice structure, and a solar cell having the same shape is stacked on the upper surface of each of the plurality of unit metallic cells.

* * * * *